US007002242B2

(12) United States Patent
Song

(10) Patent No.: US 7,002,242 B2
(45) Date of Patent: Feb. 21, 2006

(54) BALL GRID ARRAY PACKAGE SEMICONDUCTOR DEVICE HAVING IMPROVED POWER LINE ROUTING

(75) Inventor: Ki-whan Song, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 09/811,666

(22) Filed: Mar. 20, 2001

(65) Prior Publication Data

US 2001/0050433 A1      Dec. 13, 2001

(30) Foreign Application Priority Data

Jun. 9, 2000     (KR) ............................. 2000-31666

(51) Int. Cl.
*H01L 23/48*     (2006.01)
*H01L 23/52*     (2006.01)
*H01L 29/40*     (2006.01)

(52) U.S. Cl. ................. 257/691; 257/692; 257/698; 257/738; 257/780; 257/773; 257/784; 257/786

(58) Field of Classification Search .............. 257/691, 257/737, 738, 780, 786, 773, 692, 784, 698
See application file for complete search history.

(56) References Cited

U.S. PATENT DOCUMENTS 5,585,665 A     12/1996   Anjoh et al.
5,895,967 A *   4/1999    Stearns et al. ............... 257/691
5,920,118 A     7/1999    Kong
6,049,129 A     4/2000    Yew et al.
6,064,113 A *   5/2000    Kirkman ...................... 257/691
6,198,635 B1 *  3/2001    Shwnoy ........................ 361/760
6,211,576 B1    4/2001    Shimizu et al.

FOREIGN PATENT DOCUMENTS

| EP | 0590986 A | 4/1994 |
| JP | 10-256457 | 9/1998 |
| JP | 10-284678 | * 10/1998 |
| JP | 2000-100814 | 4/2000 |

* cited by examiner

*Primary Examiner*—Nitin Parekh
(74) *Attorney, Agent, or Firm*—Volentine Francos & Whitt, PLLC

(57) ABSTRACT

A ball grid array package semiconductor device having improved power line routing. The BGA package semiconductor device includes a semiconductor chip having a plurality of pads along its center, a substrate having a slot of a predetermined size along its center, and a signal line plane including a signal line pattern and a plurality of ball mounts on its one side, with the semiconductor chip being mounted on the other side. A bonding material is inserted between the semiconductor chip and the substrate to fix the semiconductor chip to the substrate. A plurality of balls are mounted on the plurality of ball mounts to be connected to an external circuit. The signal line plane is divided into two or more signal line planes including a first line plane and a second line plane. Lines for the first power are formed only on the first signal line plane, and lines for the second power are formed only on the second signal line plane.

8 Claims, 7 Drawing Sheets

US 7,002,242 B2

BALL GRID ARRAY PACKAGE SEMICONDUCTOR DEVICE HAVING IMPROVED POWER LINE ROUTING

BACKGROUND OF THE INVENTION

1. Field of the Invention

The present invention relates to a semiconductor device, and more particularly, to a ball grid array (BGA) package semiconductor device having a ball shaped contact portion for interfacing with the external circuit.

2. Description of the Related Art

As electronic appliances become smaller, lighter and thinner, the semiconductor devices which form the building blocks of the electronic appliance must also become smaller, lighter and thinner. Accordingly, older semiconductor packaging technologies, for example, dual in-line packages (DIP), small outline with J-leads (SOJ), and quad flat packages (QFP), are being supplanted with newer packaging technologies such as ball grid array (BGA) and chip scale packages (CSP). In these improved BGAs or CSPs, a ball is used instead of a conventional lead to reduce the size of a semiconductor package as much as possible. Investment into research and development to reduce the size of a semiconductor package to the size of a chip continues unabated.

The use of BGA packages using a ball instead of a conventional lead has expanded, including such devices as Rambus dynamic random access memories (RDRAMs). The BGA package connects a pad in a semiconductor device to a ball through a predetermined signal circuit pattern formed on a substrate. Unlike a bonding wire used in a conventional SOJ package, a signal circuit pattern is advantageous in combining a plurality of signal lines or a plurality of power lines.

A CSP semiconductor device employing a conventional BGA package type is disclosed in U.S. Pat. No. 5,920,118.

FIGS. 1A and 1B are a plan view and a sectional view, respectively, of the BGA package semiconductor device described in the above patent. Referring to FIGS. 1A and 1B, the conventional BGA package semiconductor device includes a single layer substrate 110, a semiconductor chip 120 having a plurality of pads 122 positioned along a central axis, a bonding unit 140 between the semiconductor chip 120 and the substrate 110, and a plurality of balls 150 for connection with an external circuit. The substrate 110 has ball mounts 116, on which the balls 150 are mounted along one plane. The ball mounts 116 are connected to the pads 122 of the semiconductor chip 120 through slot 112 via a predetermined signal circuit pattern 114 and bonding wires 130.

However, for a conventional BGA package semiconductor device which is supplied with two or more types of external power, at least two external power supplies need to be separately connected to the device, thereby restricting the combination between the lines of the same power. Accordingly, as shown in FIG. 1A, separated power lines are formed. Since the separated power lines have a narrow gap therebetween, the inductance of a power line increases.

The problems associated with the conventional technology will be described in detail with reference to FIG. 2. FIG. 2 is a detailed diagram illustrating the pattern of one side of the substrate 110 of a conventional BGA package semiconductor device. Referring to FIG. 2, a plurality of pads 122 are arranged in a line along the center of the single layer substrate 110, and the pads 122 are electrically connected to ball mounts (circled portions in FIG. 2) through various thick and thin interconnection lines. The ball mounts labeled VDD are power ball mounts, and the ball mounts labeled VSS are ground ball mounts. The other ball mounts are signal ball mounts.

In such a conventional BGA package semiconductor device, the power ball mounts, the ground ball mounts and the signal ball mounts are arranged in mixed patterns on a surface of a single layer substrate on both sides of a slot formed in the substrate. Therefore, one must be careful that the various interconnections are adequately separated to avoid crossing the various leads in these mixed patterns.

Referring to FIG. 2, note the area denoted by reference numeral 170, where both a power line connected to a power ball mount VDD and a ground line connected to a ground ball mount VSS are routed through between two adjacent signal ball mounts. In such case, the interconnections lines must be narrower, which increases the inductance of the power line, thereby causing reliability problems.

In the area denoted by reference numeral 172, there is shown another problem. Here, the interconnection line is connected between just a single ball mount and a pad, and the interconnection line is not connected to another of the same kind of ball mount. Such an interconnection scheme increases switching noise.

As described above, when various types of interconnection lines are designed on a single layer substrate of a BGA package semiconductor device together with a plurality of ball mounts according to the conventional technology, switching noise may be increased and power reliability may be decreased. Both can lead to an erroneous operation of a semiconductor device.

SUMMARY OF THE INVENTION

To solve the above problems, it is a first object of the present invention to provide a ball grid array (BGA) package semiconductor device for reducing the inductance and supplying stable power. This is achieved by properly separating the lines of different power and combining the lines of the same power as much as possible on the package.

It is a second object of the present invention to provide a BGA package semiconductor device having a single substrate with a plurality of merged power ball mounts and a plurality of merged ground ball mounts.

Accordingly, to achieve the first object of the invention, in one embodiment, the present invention provides a ball grid array package semiconductor device which is supplied with two or more external powers including a first power and a second power. The BGA package semiconductor device includes a semiconductor chip having a plurality of pads along its center, a substrate having a slot of a predetermined size along its center, and a signal line plane including a signal line pattern and a plurality of ball mounts on its one side, with the semiconductor chip being mounted on the other side. A bonding material is inserted between the semiconductor chip and the substrate to fix the semiconductor chip to the substrate. A plurality of balls are mounted on the plurality of ball mounts to be connected to an external circuit. The signal line plane is divided into two or more signal line planes including a first line plane and a second line plane. Lines for the first power are formed only on the first signal line plane, and lines for the second power are formed only on the second signal line plane.

Preferably, the lines for the first power are combined with each other on the first signal line plane, thereby forming one combined plane exhibiting a single node electrically. The lines for the second power are combined with each other on the second signal line plane, thereby forming another combined plane exhibiting a single node electrically.

In another embodiment, the present invention provides a ball grid array package semiconductor device which is supplied with two or more external powers. The BGA package semiconductor device includes a semiconductor chip having a pad in its center, a substrate including a slot of a predetermined size in its center, and a signal line plane including a signal line pattern and a plurality of ball mounts on its one side, with the semiconductor chip being mounted on the other side. A bonding material is inserted between the semiconductor chip and the substrate to fix the semiconductor chip to the substrate. A plurality of balls are mounted on the plurality of ball mounts to be connected to an external circuit. The signal line plane is divided into a plurality of signal line planes. Lines for at least one selected power among the external powers are formed only on a corresponding signal line plane.

Preferably, the lines for the at least one selected power among the external powers are combined with each other on the corresponding signal line plane, thereby forming a combined plane exhibiting a single node electrically.

To achieve the second object of the invention, the present invention provides a BGA package semiconductor device having a plurality of balls including a plurality of power balls and a plurality of ground balls. The BGA package semiconductor device includes a semiconductor chip having, at its center, a plurality of pads including a plurality of power pads and a plurality of ground pads, and a single layer substrate. The single layer substrate includes on its one side a slot of a predetermined size at its center. A power plane has a plurality of power ball mounts on one surface arranged around the slot, where the power plane is shared by the power balls and the power pads. A ground plane has a plurality of ground ball mounts on the other surface arranged around the slot, where the ground plane is shared by the ground balls and the ground pads. There are also included a plurality of signal ball mounts. The semiconductor chip is mounted on the other side of the substrate so that the pads are electrically connected to the power ball mounts, the ground ball mounts and the signal ball mounts.

The BGA package semiconductor device of the present invention can greatly reduce the inductance occurring in the power lines on a package of the semiconductor device. Therefore, the power characteristic and the reliability of semiconductor devices can be improved.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE PREFERRED EMBODIMENT

Figure 1A:
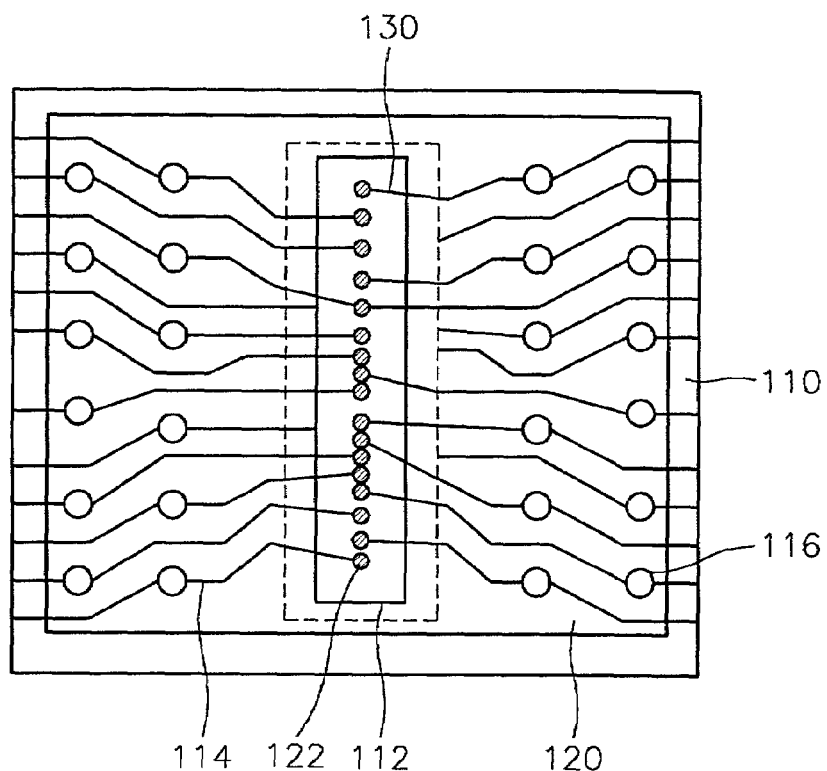
FIGS. 1A and 1B are plan and cross section views, respectively, illustrating a conventional ball grid array (BGA) package semiconductor device.
Figure 1B:
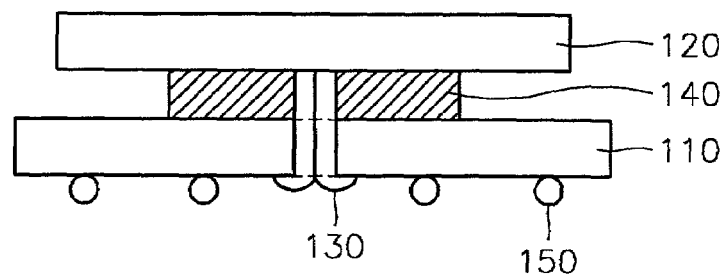
Figure 2:
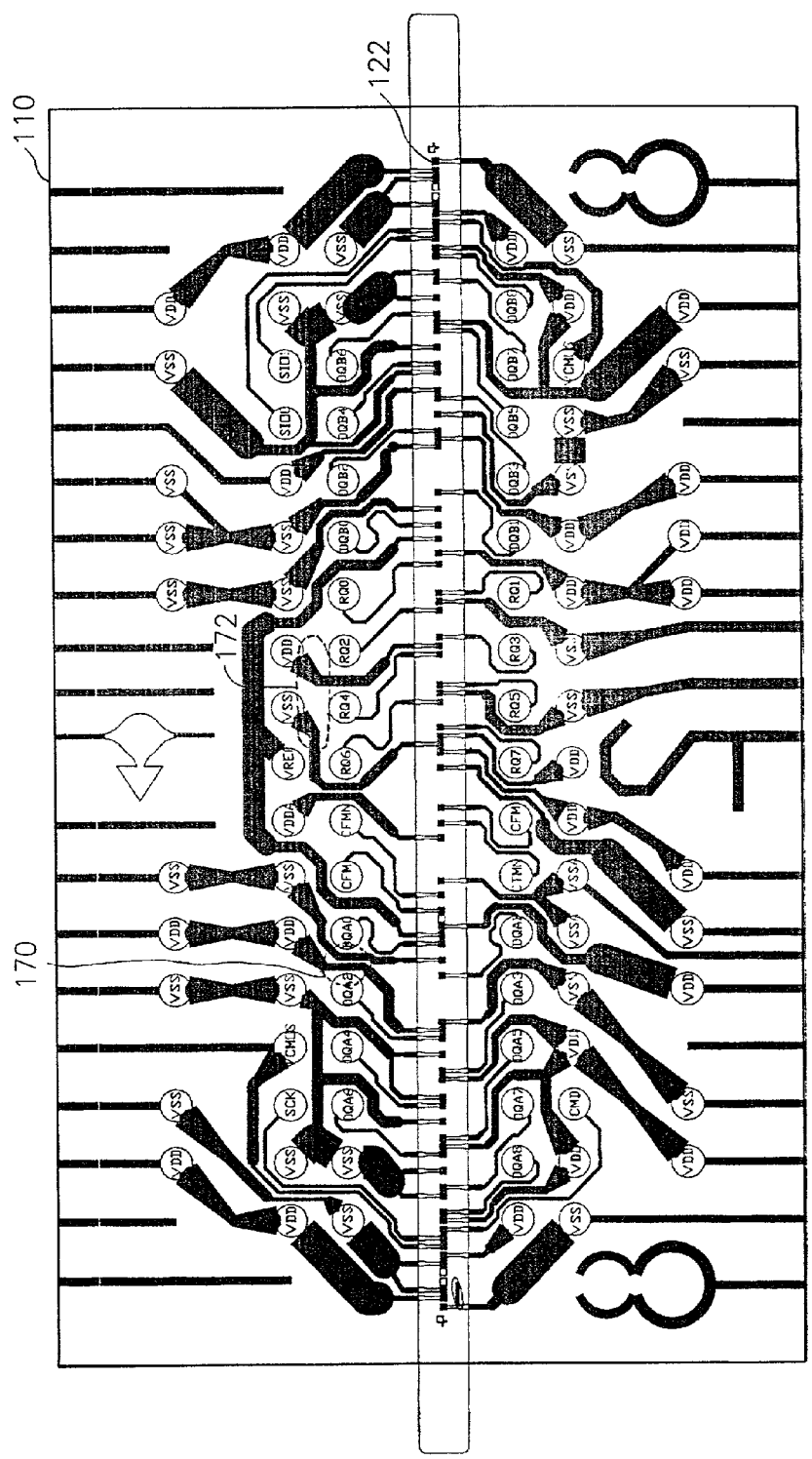
FIG. 2 is a detailed diagram illustrating the pattern of one side of the substrate of a conventional BGA package semiconductor device.

Hereinafter, embodiments of the present invention will be described in detail with reference to the attached drawings. The same reference numerals or characters denote the same members or signals performing the same function in the drawings.

Figure 3A:
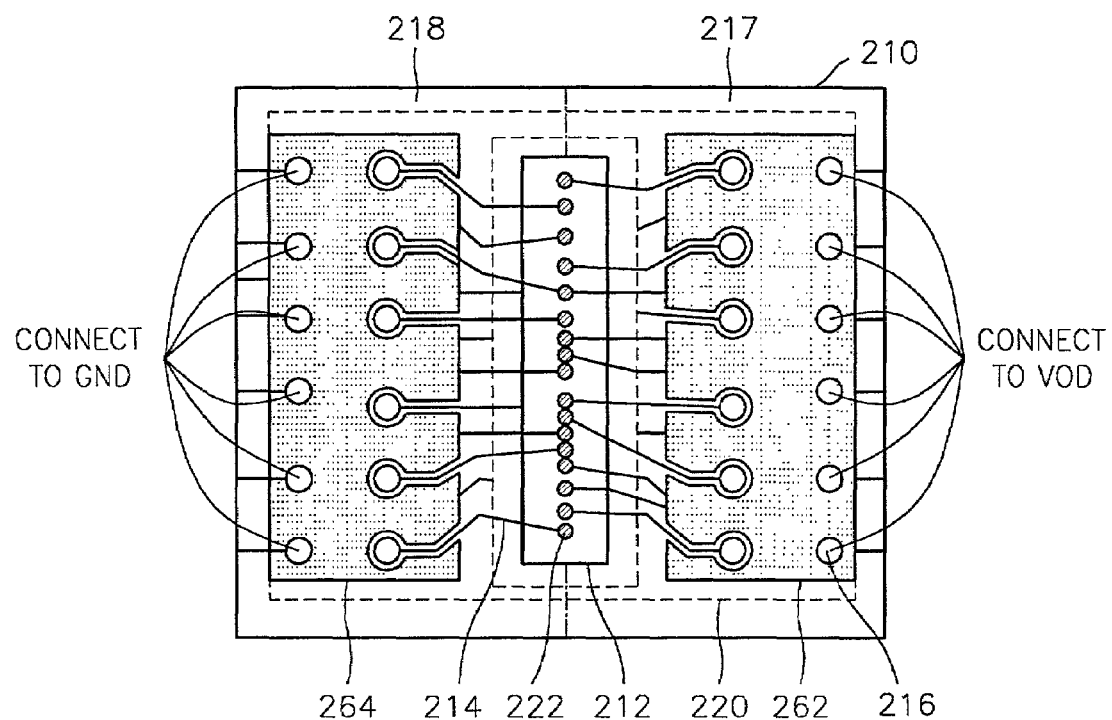
FIGS. 3A and 3B are plan and cross section views, respectively, illustrating a BGA package semiconductor device according to an embodiment of the present invention.
Figure 3B:
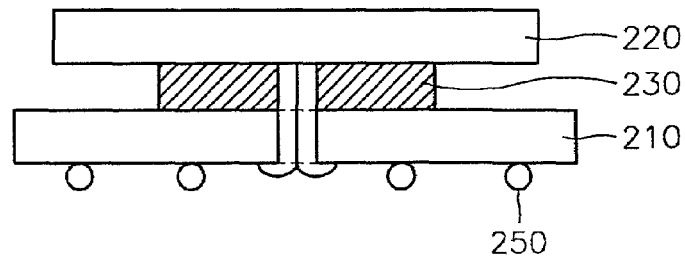

FIG. 3A is a schematic plan view of a ball grid array (BGA) package semiconductor device according to one embodiment of the present invention, and FIG. 3B is a sectional view thereof. Referring to FIGS. 3A and 3B, the BGA package semiconductor device includes a semiconductor chip 220, a substrate 210, a bonding unit 230 and a plurality of balls 250. The BGA package semiconductor device of this embodiment is supplied with power from two or more external supplies having different voltages.

The semiconductor chip 220 has a plurality of pads 222 arranged in a line along its central axis. The semiconductor chip 220 interfaces with the external circuit through the pads 222.

The substrate 210 serves to support the semiconductor chip 220. In other words, the semiconductor chip 220 is mounted on the substrate 210. The bonding unit or bonding material 230 is provided between the substrate 210 and the semiconductor chip 220 to fix the semiconductor chip 220 to the substrate 210. The substrate 210 serves to connect the semiconductor chip 220 to the outside of the semiconductor device through a predetermined signal line pattern 214 and the balls 250. For this, the surface of the substrate 210 that does not contact the bonding unit 230 is provided with a signal line plane. As such, the semiconductor chip 220 is mounted on the top of the substrate 210, and the signal line plane is formed on the bottom of the substrate 210. A plurality of ball mounts 216 and the signal line pattern 214 are formed on the signal line plane. The balls 250 are mounted on the ball mounts 216, respectively, so that the semiconductor device can be connected to an external circuit.

The substrate 210 has a central slot 212 of a predetermined size, and is arranged such that the signal line pattern 214 is connected to the pads 222 of the semiconductor chip 220 through the slot 212. Ultimately, the semiconductor chip 220 interfaces with the outside through the pads 222, the signal line pattern 214 and the balls 250.

As shown in FIG. 3A, the signal line plane is divided into two or more signal line planes. Since the vertically elongated slot 212 is provided in the center of the substrate 210, it is preferable to define the divided signal line plane with reference to the slot 212. In this embodiment, two signal line planes are defined, namely, a first signal line plane 217 and a second signal line plane 218, respectively.

Figure 4:
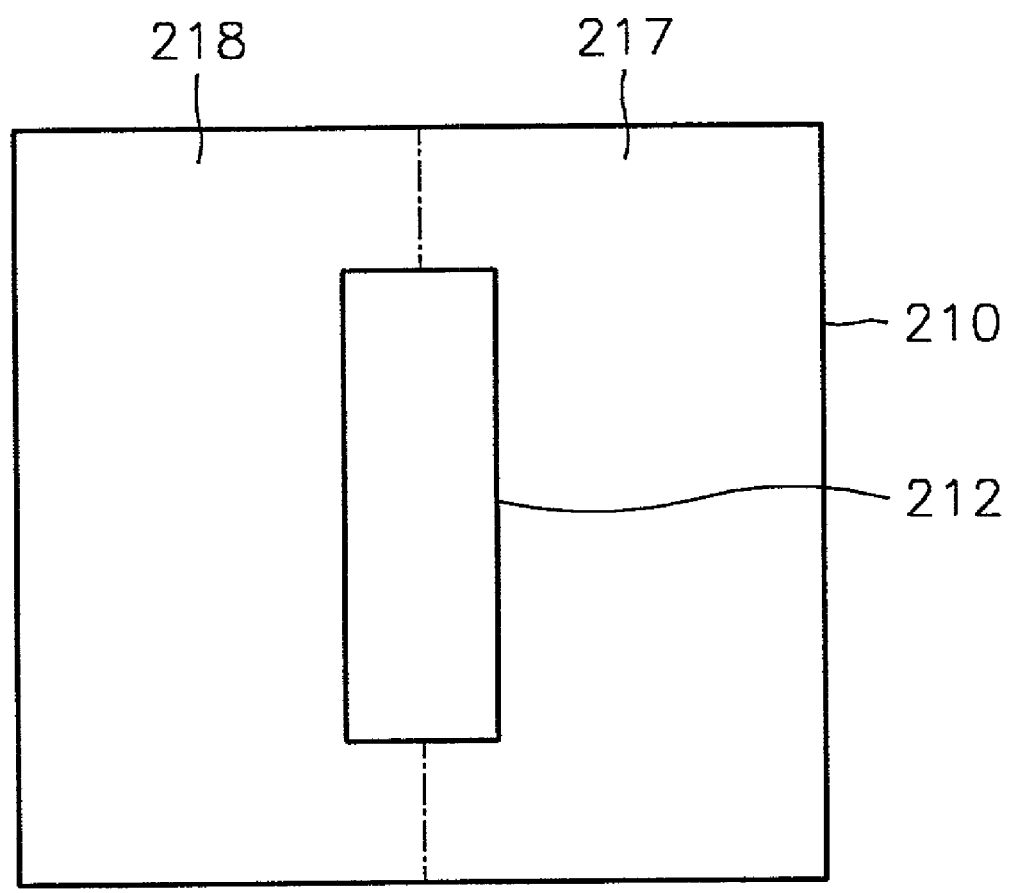
FIG. 4 is a diagram illustrating a signal line plane including a first signal line plane and a second signal line plane in the BGA package semiconductor device of FIGS. 3A and 3B.

FIG. 4 is a diagram which better illustrates the boundaries of the signal line plane that is divided into the first signal line plane 217 and the second signal line plane 218. One type of power (hereinafter, referred to as a first power) of the external powers is applied only through the first signal line plane 217. The first power is thus applied to the semiconductor device only through a signal line pattern formed on the first signal line plane 217. Accordingly, lines for the first power can be conveniently combined on the first signal line plane 217, and as shown in FIG. 3A, the combined lines of the first power forms a first power plane 262, which exhibits a single node electrically.

In the same way, the other type of power (hereinafter, referred to as a second power) of the external powers is applied only through a signal line pattern formed on the second signal line plane 218. The second power is thus applied to the semiconductor device only through a signal line pattern formed on the second signal line plane 218. Accordingly, lines for the second power can be conveniently combined on the second signal line plane 218, and as shown in FIG. 3A, the combined lines of the second power forms a second power plane 264, which exhibits a single node electrically.

Accordingly, power having different voltages for the first and the second powers are separately supplied through the two planes 262, 264 divided by the slot 212. Thus the burden required for separating the lines of the first power from the lines of the second power is reduced. In addition, the lines of each of the first and the second powers are combined with each other, so that the width of the combined line of each of the first and second powers is increased. Consequently, inductance is greatly decreased. Therefore, the problems associated with the conventional mixed power line routing schemes, namely increased inductance and reduced power reliability, can be improved. Preferably, the first power is a power VDD having a positive voltage, and the second power is ground GND.

Referring back to FIG. 3A, a line of ball mounts 216 are arranged on a peripheral edge of each of the first and the second signal line planes 217 and 218. Balls mounted on the ball mounts 216 on the peripheral edge of the first signal line plane 217 are all connected to the first power VDD. Balls mounted on the ball mounts 216 on the peripheral edge of the second signal line plane 218 are all connected to the second power GND. Signals other than power are input or output through the balls mounted on the other ball mounts 216. It is understood a different power besides the first and second powers VDD and GND may be input to the signal balls.

Figure 5:
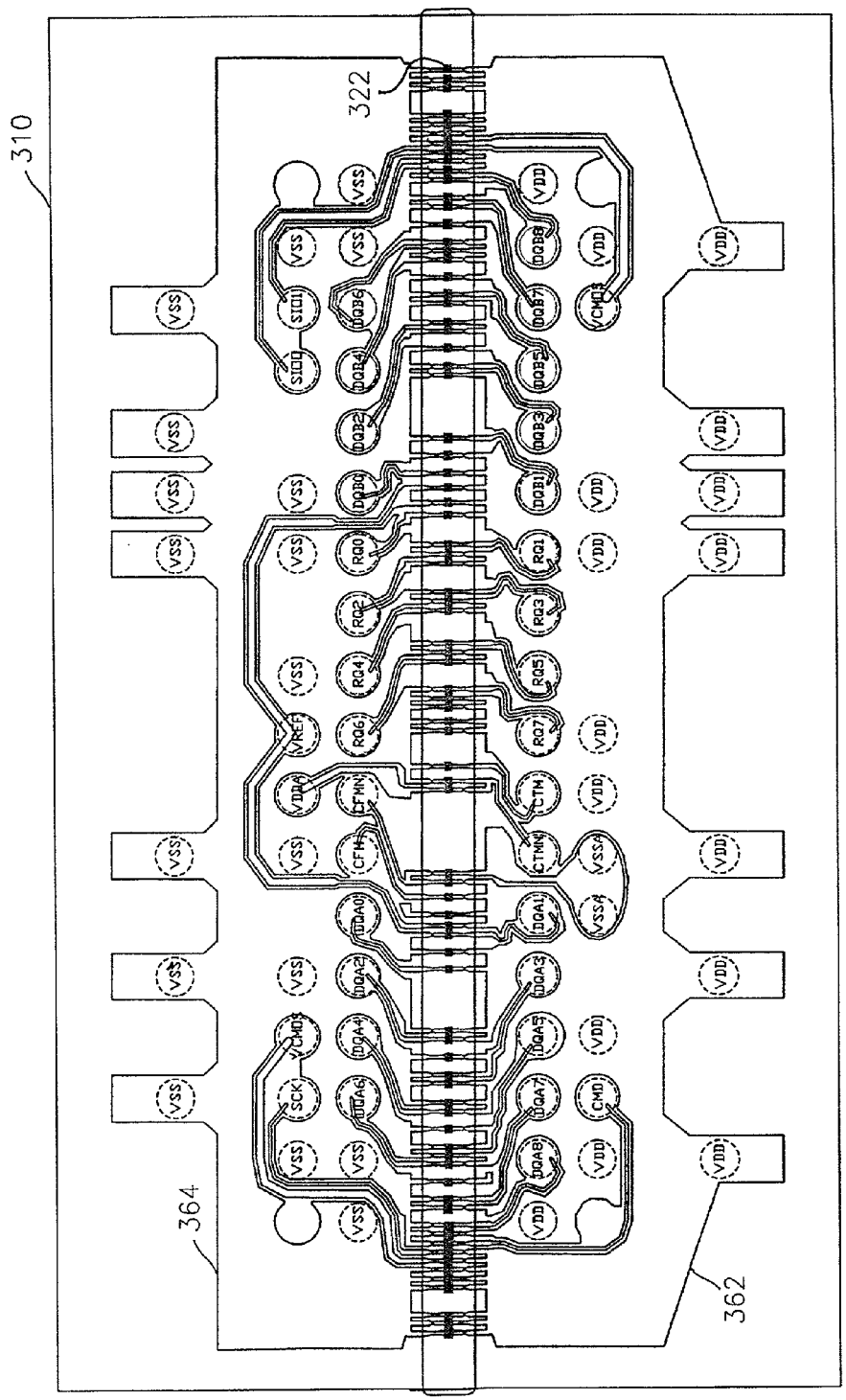
FIG. 5 is a detailed diagram illustrating the pattern of one side of the substrate of a BGA package semiconductor device according to the embodiment of the present invention.

FIG. 5 is a detailed diagram illustrating the pattern of one side of the substrate of a BGA package semiconductor device according to the embodiment of the preset invention. Referring to FIG. 5, a plurality of pads 322 are arranged in a line along the center of the a single layer substrate 310. Among the ball mounts (circled portions), ball mounts referred to as VDD are power ball mounts, and ball mounts referred to as VSS are ground ball mounts. The other ball mounts are signal ball mounts. The power ball mounts are formed only on a power plane 362, and the ground ball mounts are formed only on a ground plane 364. The other signal ball mounts can be formed on either of both planes. The signal ball mounts may be connected to a power type other than the power VDD or the ground VSS.

The power plane 362 electrically merges the plurality of power ball mounts on the single layer substrate 310. Accordingly, power pads are not connected to particular power ball mounts but are connected to the power plane 362. Signal pads are connected to the signal ball mounts via interconnection lines. The boundary defining the power plane 362 wraps around signal ball mounts positioned on the power plane 362 and their interconnection lines.

The ground plane 364 electrically merges the plurality of ground ball mounts on the single layer substrate 310. Accordingly, ground pads are not connected to particular ground ball mounts but are connected to the ground plane 364. The boundary defining the ground plane 364 wraps around signal ball mounts positioned on the ground plane 364 and their interconnection lines.

Consequently, on the substrate of a semiconductor device according to the present invention, there are no instances where both a power line connected to a power ball mount and a ground line connected to a ground ball mount are routed through between two adjacent signal ball mounts. Nor are there instances where a separate interconnection line is just connected between a single ball mount and a pad, and not connected to another of the same kind of ball mount. Therefore, the inductance of the power line decreases, and the reliability of the power supply is improved.

In those cases where a separate power or ground line is supplied apart from the power or ground plane 362 or 364—for example, to supply stable power or ground to a specific circuit such as a delay-locked loop (DLL) or a phase-locked loop (PLL)—a power or ground ball mount connected to the separated power or ground line is not merged into the power or ground plane 362 or 364. The separated power or ground ball mount and its interconnection line are treated like a signal ball mount and its interconnection line during a routing process.

When the semiconductor chip of a BGA package semiconductor device according to the present invention includes a triple-well structure or a twin-well structure, which has a P-substrate, the first power VDD may be applied to an N-well, and the second power GND may be applied to the P-substrate or a pocket P-well.

Figure 7:
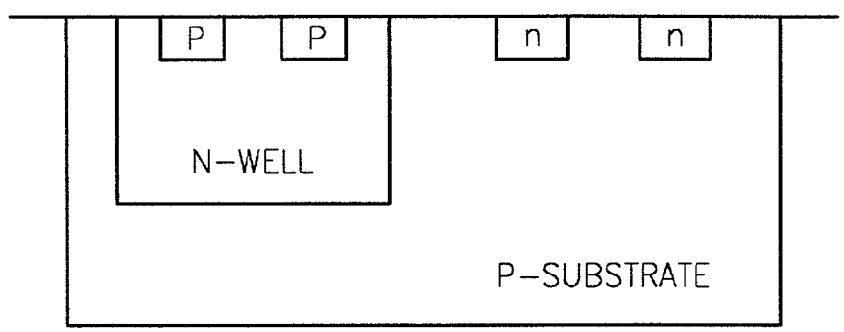
FIG. 7 is a sectional view illustrating an example of a twin-well structure having a P-substrate.
Figure 8:
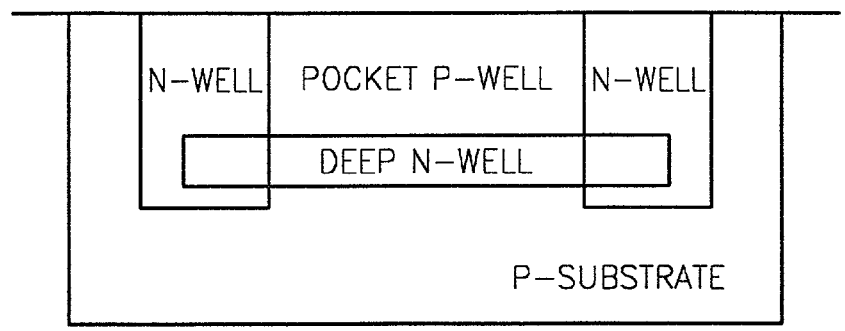
FIG. 8 is a sectional view illustrating an example of a triple-well structure having a P-substrate.

FIGS. 7 and 8 are sectional views illustrating examples of a twin-well structure having a P-substrate and a triple-well structure having a P-substrate, respectively. For the twin-well structure of FIG. 7, an N-well is formed by implanting an N-impurity into the P-substrate, and a drain and source region are formed in the N-well region. For the triple-well structure of FIG. 8, an N-well having a quadrilateral donut shape is formed, and a deep N-well is formed at a predetermined depth, such that a pocket P-well is formed by the quadrilateral donut-shaped N-well and the deep N-well at the lower portion.

In the above described embodiments, two powers were selected from two or more external powers and were separated by a slot. However, various modifications can be made within the scope and spirit of the present invention. For example, a signal line plane may be divided into a plurality of signal line planes, and lines for at least one of the two or more external powers may be formed only on a corresponding signal line plane. The corresponding signal line plane is thus a plane on which only lines for signals other than the external powers and the lines for the selected external power are formed. Lines for the other unselected external powers may be mixed on the other signal line planes except signal line planes corresponding to selected external powers.

Figure 6:
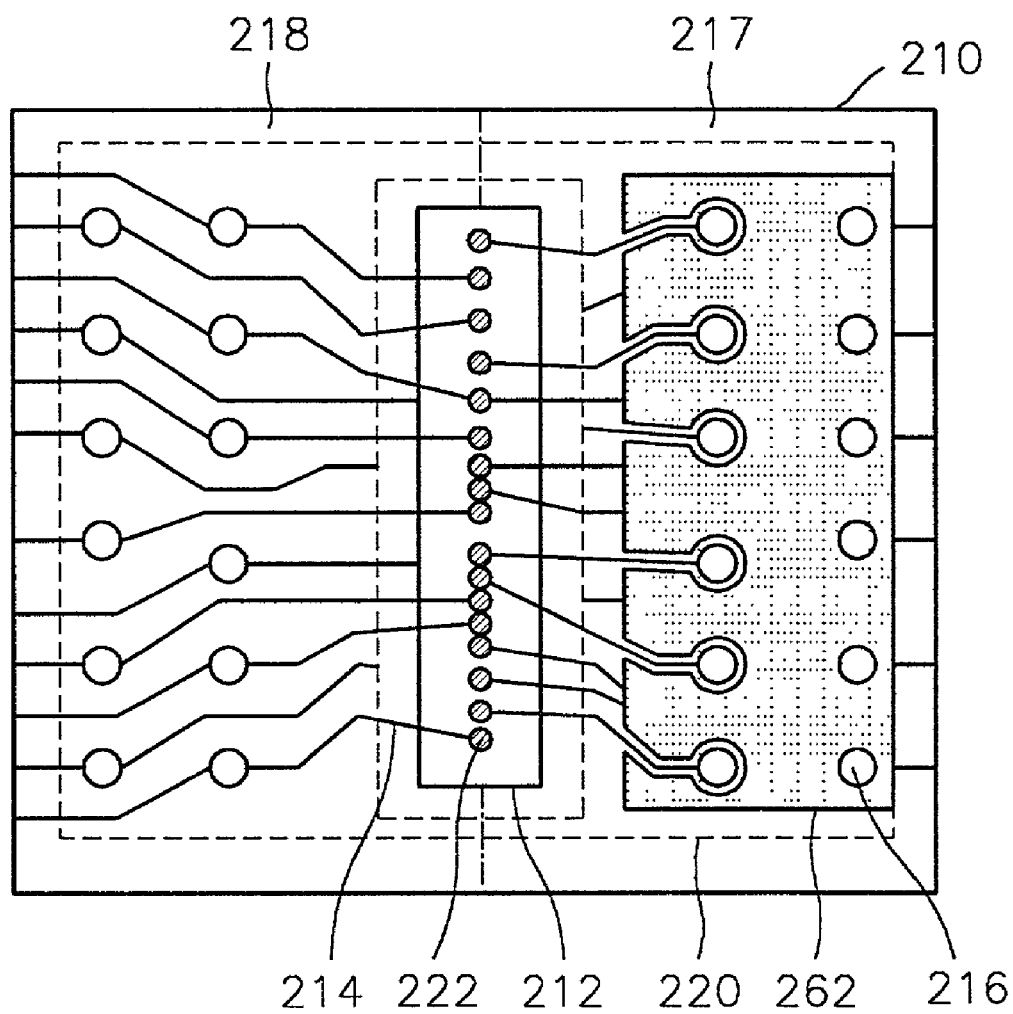
FIG. 6 is a schematic plan view illustrating a BGA package semiconductor device according to another embodiment of the present invention.

FIG. 6 is a plan view of a BGA package semiconductor device according to another embodiment of the present invention. In this embodiment, only one of the external powers is selected and separately applied only through one signal line plane. The other external powers are applied together through the other signal line plane.

The structure of the BGA package semiconductor device of FIG. 6 is the same as that of the BGA package semiconductor device of FIGS. 3A and 3B, and thus a description of each element will be omitted.

In the embodiment of FIG. 6, only one power is selected from the external powers. When the selected power is referred to as a first power, as shown in the embodiment of FIG. 3A, the first power is applied through only a first signal line plane 217. Lines for the other external powers are formed on a second signal line plane 218 for power supply. The first power may be a power VDD having a positive voltage or may be ground GND.

Accordingly, the reliability of power supply can be improved by routing power lines such that one external power which is most problematic with respect to inductance and reliability is selected and supplied separately from the other external powers.

When the first power is a power VDD having a positive voltage, it may be applied to an N-well in a BGA package semiconductor device including a semiconductor chip having a triple-well structure with a P-substrate, or a twin-well structure with a P-substrate. In another case, when the first power is ground GND, it may be applied to a P-substrate or a pocket P-well in a BGA package semiconductor device including a semiconductor chip having a triple-well structure with the P-substrate, or a twin-well structure with the P-substrate.

It is preferable to form BGA package semiconductor devices according to the above embodiments in the form of a chip scale package (CSP) to reduce the size of the packages. A CSP is defined as a semiconductor package, the size of which is nearly the same as that of a semiconductor chip, or does not exceed the size of a semiconductor chip by a maximum of 20%.

According to a BGA package semiconductor device of the present invention, the inductance occurring in power lines on a package of the semiconductor device can be greatly reduced. In addition, power lines can be easily routed. Accordingly, the present invention greatly improves the power characteristic and the reliability of semiconductor devices.

Although the invention has been described with reference to particular embodiments, these embodiments are disclosed just for description. It will be understood by one of ordinary skill in the art that modifications of the described embodiments may be made. Therefore, the scope of the invention will be defined by the attached claims.

What is claimed is:

1. A ball grid array package semiconductor device, the device being supplied with two or more external powers including a first power and a second power, the device comprising:

a semiconductor chip having a plurality of pads arranged along a first surface thereof;

a substrate having a first surface which confronts the first surface of the semiconductor chip and an opposite second surface, the substrate further having a slot extending there through which is aligned over the plurality of pads to expose the plurality of pads;

a bonding material inserted between the respective first surfaces of the semiconductor chip and the substrate to fix the semiconductor chip to the substrate;

a first power plane located over the second surface of the substrate on one side only of the slot, wherein the first power plane is electrically connected to at least one of the plurality of pads through the slot;

a second power plane located over the second surface of the substrate on another side only of the slot, wherein the second power plane is electrically connected to at least one of the plurality of pads through the slot;

a first plurality signal ball mounts located within the first power plane and electrically isolated from the first power plane;

a first plurality of signal lines extending from the respective first plurality of signal ball mounts to a peripheral region of the first power plane, wherein the first plurality of signal lines extend through respective gaps in the first power plane and are electrically isolated from the first power plane;

a first plurality of wirings extending through the slot and connected between the respective first plurality of signal lines and respective ones of the plurality of pads;

a second plurality of signal ball mounts located within the second power plane and electrically isolated from the second power plane;

a second plurality of signal lines extending from the respective second plurality of signal ball mounts to a peripheral region of the second power plane, wherein the second plurality of signal lines extend through respective gaps in the second power plane and are electrically isolated from the second power plane;

a second plurality of wirings extending through the slot and connected between the respective second plurality of signal lines and respective ones of the plurality of pads;

a first plurality power ball mounts located within the first power plane and electrically contacting the first power plane;

a second plurality of power ball mounts located within the second power plane and electrically contacting the second power plane;

a plurality of signal balls respectively mounted on the first and second pluralities of signal ball mounts and electrically isolated from the first and second power planes;

a first plurality of power balls which receive the first power and which are respectively mounted on the first plurality of power ball mounts so as to electrically contact the first power line plane; and a second plurality of power balls which receive the second power and which are respectively mounted on the second plurality of power ball mounts so as to electrically contact the second power line plane.

2. The ball grid array package semiconductor device of claim 1, wherein the device is a chip scale package semiconductor device.

3. The ball grid array package semiconductor device of claim 1, wherein the first power has a positive voltage and the second power is ground.

4. The ball grid array package semiconductor device of claim 3, wherein the semiconductor chip comprises a triple-well structure having a P-substrate, the first power is applied to an N-well of the semiconductor chip, and the second power is applied to the P-substrate and a pocket P-well of the semiconductor chip.

5. The ball grid array package semiconductor device of claim 3, wherein the semiconductor chip comprises a triple-well structure having a P-substrate, the first power is applied to an N-well of the semiconductor chip, and the second power is applied to one of the P-substrate and a pocket P-well of the semiconductor chip.

6. The ball grid array package semiconductor device of claim 3, wherein the semiconductor chip comprises a twin-well structure, the first power is applied to an N-well of the semiconductor chip, and the second power is applied to a P-substrate of the semiconductor chip.

7. The ball grid array package semiconductor device of claim 1, wherein the peripheries of the first and second power planes are each substantially rectangular.

8. The ball grid array package semiconductor device of claim 1, wherein the first and second wiring are bonding wires.

* * * * *